United States Patent [19]
Fournel et al.

[11] Patent Number: 6,049,900
[45] Date of Patent: Apr. 11, 2000

[54] AUTOMATIC PARALLEL ELECTRONIC COMPONENT TESTING METHOD AND EQUIPMENT

[75] Inventors: Jean-Claude Fournel, Saint-Victor Malescours; Daniel Chausse, Saint-Etienne; Jean-Louis Murgue, Saint-Romaine-les-Atheux, all of France

[73] Assignee: Schlumberger Industries, Montrouge, France

[21] Appl. No.: 08/930,492

[22] PCT Filed: Apr. 10, 1996

[86] PCT No.: PCT/FR96/00541

§ 371 Date: Sep. 30, 1997

§ 102(e) Date: Sep. 30, 1997

[87] PCT Pub. No.: WO96/33461

PCT Pub. Date: Oct. 24, 1996

[30] Foreign Application Priority Data

Apr. 19, 1995 [FR] France .................................. 95 04776

[51] Int. Cl.[7] .................................................... G01R 31/28
[52] U.S. Cl. ......................... 714/724; 714/733; 714/744
[58] Field of Search .................................... 714/724, 733, 714/734, 735, 736, 738, 744; 324/158.1, 73.1, 76.11

[56] References Cited

U.S. PATENT DOCUMENTS

| | | | |
|---|---|---|---|
| 4,928,278 | 5/1990 | Otsuji et al. | 371/22.3 X |
| 4,972,413 | 11/1990 | Littlebury | 371/22.1 |
| 5,025,205 | 6/1991 | Mydill et al. | 324/73.1 |
| 5,142,223 | 8/1992 | Higashio et al. | 371/22.1 X |
| 5,461,310 | 10/1995 | Cheung et al. | 324/158.1 |
| 5,479,415 | 12/1995 | Staiger | 371/22.1 X |
| 5,654,971 | 8/1997 | Heitele et al. | 371/24 |
| 5,835,506 | 11/1998 | Kuglin | 371/27.1 |

*Primary Examiner*—Hoa T. Nguyen
*Attorney, Agent, or Firm*—Frishauf, Holtz, Goodman, Langer & Chick, P.C.

[57] ABSTRACT

A method of automatically testing electronic components in parallel, identical pins ($i$; $i+1$) of said components interchanging test signals with at least one common test circuit (20; 20') which includes, firstly, timing generators (22a, 22b, 22c, 22d; 22'a, 22'b, 22'c, 22'd) controlled by a test programming memory (10) and, secondly, forcing circuits (24$_1$, 24$_2$; 24'$_1$, 24'$_2$) and comparator circuits (26$_1$, 26$_2$; 26'$_1$, 26'$_2$) controlled by said timing generators. In accordance with the invention, all the timing generators are assigned to said forcing circuits or to said comparator circuits in such manner as to produce synchronous test signals at said identical pins ($i$) of said electronic components. Applications include automatic testing of components in parallel.

5 Claims, 4 Drawing Sheets

AUTOMATIC PARALLEL ELECTRONIC COMPONENT TESTING METHOD AND EQUIPMENT

The present invention concerns a method and equipment for automatically testing electronic components in parallel.

Most digital electronic components sold are tested by their manufacturer several times before being shipped.

Component testers have two functions: firstly, generating digital signals, at logic 0 or logic 1, for example, and, secondly, verifying the presence of output transitions by comparison with a pre-established test table. The timing and the level of the signals generated and the signals compared are programmable. As a general rule, a component tester must generate and/or compare signals simultaneously at all the functional pins of the component under test.

The definition of the signals to be generated and/or compared is usually extremely complex. Testing a microprocessor can entail strings of several million 0 or 1 bits in the same sequence. To define the signals, the concept of period is used to determine a time band within which a more simple signal is defined. This signal is decomposed into timing data, also known as a time marker, and an event, for example a transition.

A functional test is therefore executed by scanning a test programming memory in which each line corresponds to a period and the content of which represents timing and event data defining the signal within the period for each pin. The timing and event data are complemented by, among other things, an instruction which controls the scanning of the test programming memory. This instruction is common to all of the functional pins of the circuit under test. The most common instruction is that to read the next line (instruction INC).

This architecture based on scanning a memory is deterministic in the sense that it assumes that it is possible to know a priori exactly what will happen at a given time at the pins of the electronic circuit under test.

A logic component tester has various parts:

a programming system, a test circuit for each pin including a system for generating stimuli, i.e. forcing signals, which must be applied to the pin in question and a system for comparing response signals from the component, and one or more interface systems, measurement heads, for adapting the stimuli to the constraints of the component to be verified.

The number of stimuli generators/comparators can be between 32 and 1,024; in the present context there is a limit of 256 generators/comparators. There can be two measurement heads, for example, each including 256 adapters.

To optimize the cost of the test and the surface area occupied by the tester, it is possible to connect identical pins of a plurality of heads to the same test circuit, i.e. to the same stimuli generation/comparison system. Multiplexers (one per signal and per pin) at the output of the generation/comparison part generally route the signals to one head or the other. Accordingly, one component is tested on head No.1 while another component is being manipulated on head No.2, and vice versa. This increases the capacity of the tester by adding one head. Typically, adding a head doubles the capacity of the tester if the test time is identical to the manipulation time.

In the case of identical components, testers with two heads used simultaneously have been proposed in which the same stimuli are generated in parallel at both heads. Likewise, the received response signals are compared with a table simultaneously by different circuits. The tester then generates two results: that from head No.1 and that from head No.2. Accordingly, the capacity of the tester is actually doubled, simply by duplicating the generation circuits and the table comparison circuits, given that the table is the same for head No.1 as for head No.2, since the signals generated and the components under test are identical.

Parallel testing therefore enables $\underline{n}$ components to be tested simultaneously in a similar way to testing a single component. The simultaneous testing can of course be done on the same head or on more than one head. The present invention addresses both of these alternatives.

In practice, electronic components are tested in parallel, in a manner that it is known in itself, by means of test circuits like that shown in FIG. 1 in the case of two components, each of these circuits testing identical pins on each component.

The generation system of the test circuit from FIG. 1 includes two forcing circuits adapted to apply stimuli, i.e. forcing signals, to identical pins of the components under test, said forcing signals being formed by two timing generators controlled by the programming memory, not shown in FIG. 1.

The comparison system includes two comparator circuits receiving from the pins response signals to the forcing signals, said response signals being compared to reference signals supplied by two other timing generators from a table supplied by the test programming memory.

In the remainder of this specification, the expression test signal is used non-specifically to refer to a forcing signal or to a response signal.

With test circuits of the type known in itself shown in FIG. 1, the pins of one component are in one-to-one correspondence with the same pins of the other component. This particular method of parallel testing, in which identical pins are forced and compared synchronously, is well-suited to components whose operation is totally known and identical from one component to another.

However, it will be noted that the repetition frequency of the test signals of the prior art circuit is limited to that of the timing generators.

Moreover, it can happen that some pins of the components under test have to be subjected to only one operation, either forcing or comparison.

It is precisely the object of the present invention to exploit this situation to increase the frequency of the test signals, respectively forcing or comparison signals, by the use of a method of automatically testing electronic components in parallel, identical pins of said components interchanging test signals with at least one common test circuit which includes, firstly, timing generators controlled by a test programming memory and, secondly, forcing circuits and comparator circuits controlled by said timing generators, characterized in that all the timing generators are assigned to said forcing circuits or to said comparator circuits in such manner as to produce synchronous test signals at said identical pins of said electronic components.

Accordingly, as explained in detail below, by assigning all of the time marking resources to the circuits specific to the operation to be carried out at the identical pins concerned of the electronic components under test, the corresponding repetition frequency is increased by a factor of 2 or even 4.

Similarly, in accordance with the invention, equipment for automatically testing electronic components in parallel comprising a plurality of test circuits respectively associated with identical pins of said components, each test circuit including, firstly, timing generators controlled by a test programming memory and, secondly, forcing circuits and comparator circuits controlled by said timing generators, is noteworthy in that said forcing circuits or said comparator circuits of at least one test circuit are connected to all the timing generators in such manner that the test signals are synchronous at said identical pins of said electronic components.

The following description with reference to the accompanying drawings, given by way of non-limiting example, shows clearly in what the invention consists and how it can be put into practice.

Figure 2:
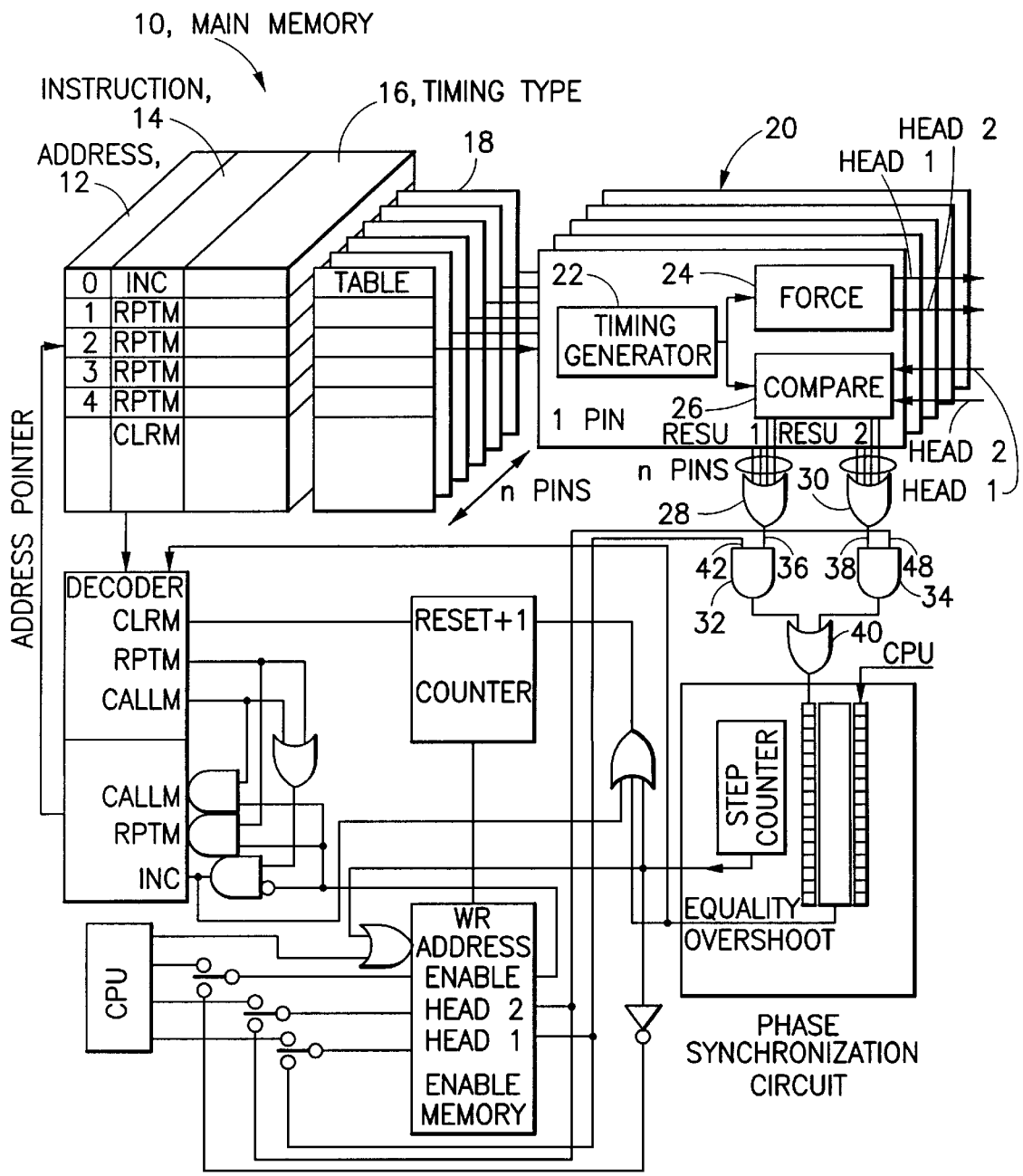
FIG. 2 is a schematic of equipment for testing electronic components in parallel.

The parallel test equipment shown diagrammatically in FIG. 2 is described in detail in French Patent Application No. 94 15559; only the components essential to an understanding of the present invention will be referred to in the remainder of this description.

The test programming memory or main memory 10 contains the instructions for executing the test functional sequence.

Each address 12 of the main memory 10 defines:

an instruction 14 that is common to all of the pins under test and controls the scanning of the main memory. CALLM and RPTM are instructions calling the phase synchronization sequence. When these instructions are invoked, the phase synchronization circuit is activated and therefore controls the scanning of the main memory 10 or of subroutines. The instruction RPTM executes the same line until the phase is synchronized. The instruction CALLM executes a series of instructions until the phase is synchronized. Thus the instruction CALLM loops the memory. The instruction INC merely goes to the next line, the definition 16 of the type of timing to use during the execution of the contents of this memory address. The timing type is common to all the pins of the tester and corresponds to the address of a memory location specific to each pin in which the time value corresponding to that address is defined. This time definition architecture corresponds to the "pin sequencer" architecture that is the subject matter of U.S. Pat. No. 5,212,443, a table 18 that corresponds to the logic content (0 or 1, for example) of the signals to be sent or to be compared. This table is specific to each pin. The tester receives from the component under test response signals that it compares with data from the table 18.

The test programming main memory 10 defines the signal to be generated for each pin. A signal generation or comparison function, identical for each pin, is therefore defined which generates the stimuli (i.e. forcing signals) from data in the memory 10 and receives response signals to be compared with data from the table 18.

This is effected by means of identical test circuits 20, each circuit being assigned to one pin and comprising a set 22 of timing generators controlling in parallel, firstly, a forcing circuit 24 (event generator) sending forcing signals to components on two heads 1 and 2, for example, and, secondly, a comparator circuit 26 receiving response signals from the heads 1 and 2 and comparing these signals with the data in the table 18.

The set 22 of timing generators defines the times at which forcing signal fronts must be generated, the times at which comparison of the response signals with table 18 must commence and the times at which comparison must cease. When the comparator circuit 26 effects a comparison, it generates a result, either conformance or non-conformance with the table. This result is specific to each pin and to each component on which comparisons are effected. In FIG. 2, this result is indicated "resu 1" for head 1 and "resu 2" for head 2. It is possible to discover if the set conforms or not by applying the "or" logic operator to all of the pins by means of OR gates 28 and 30 for head 1 and head 2, respectively.

Figure 1:
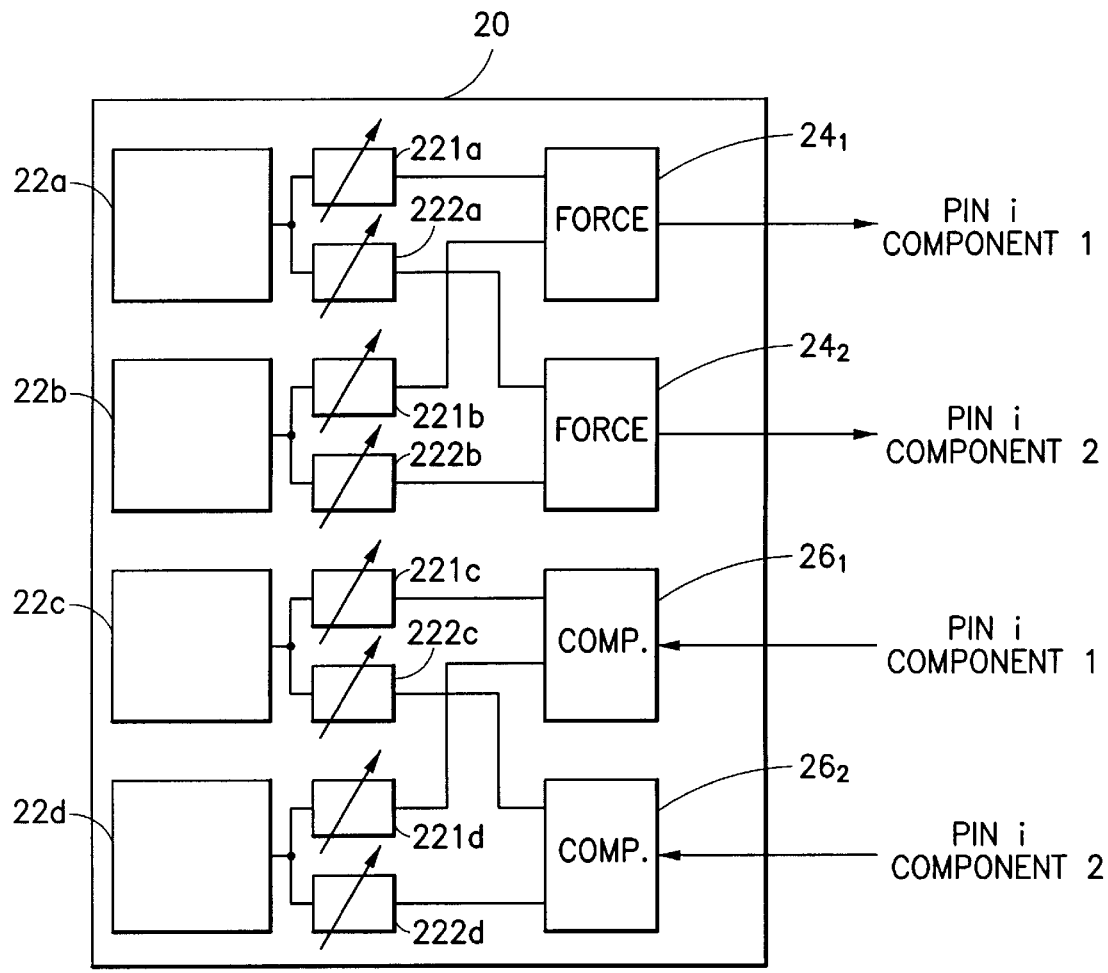
Figure 3:
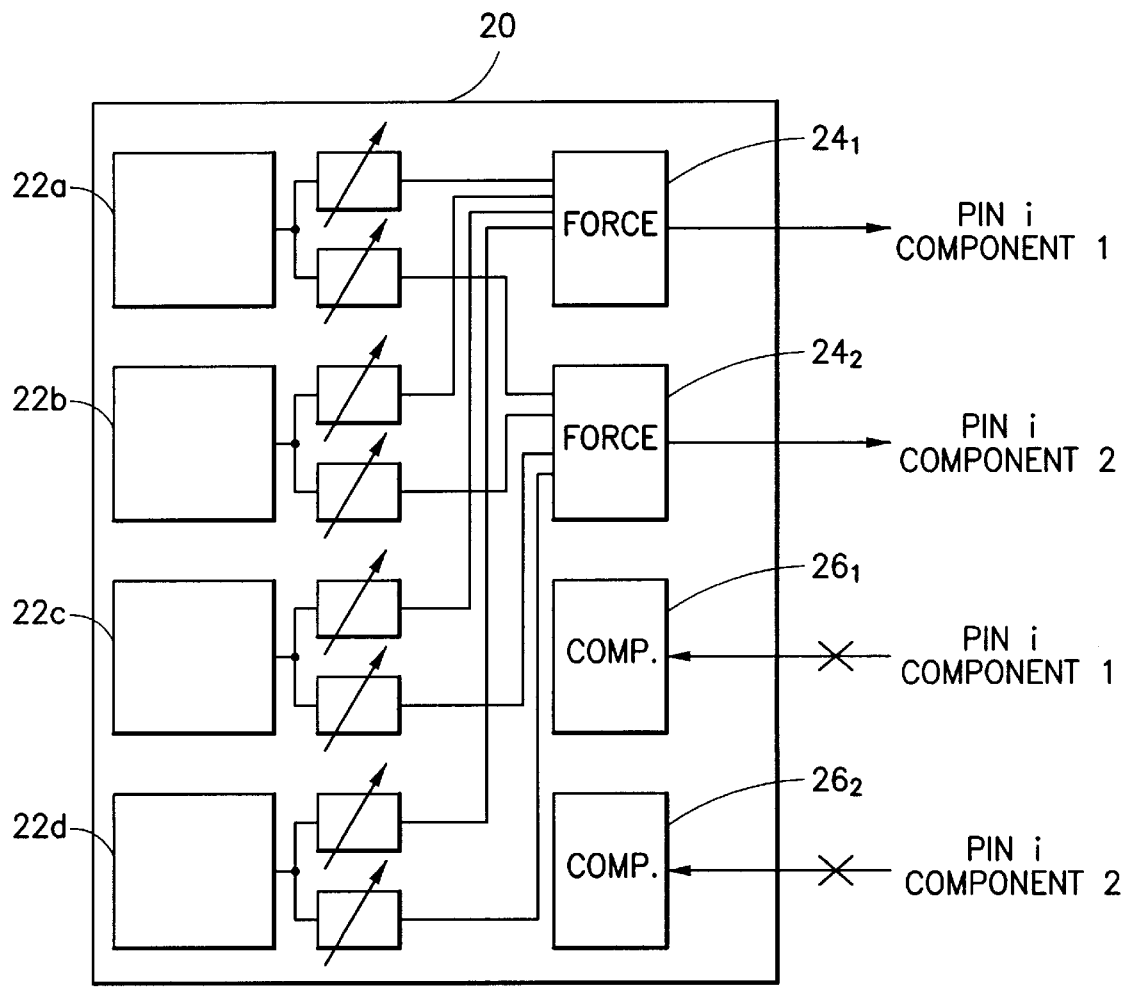
FIG. 3 is a schematic of a test circuit of parallel test equipment in accordance with the invention.
Figure 4:
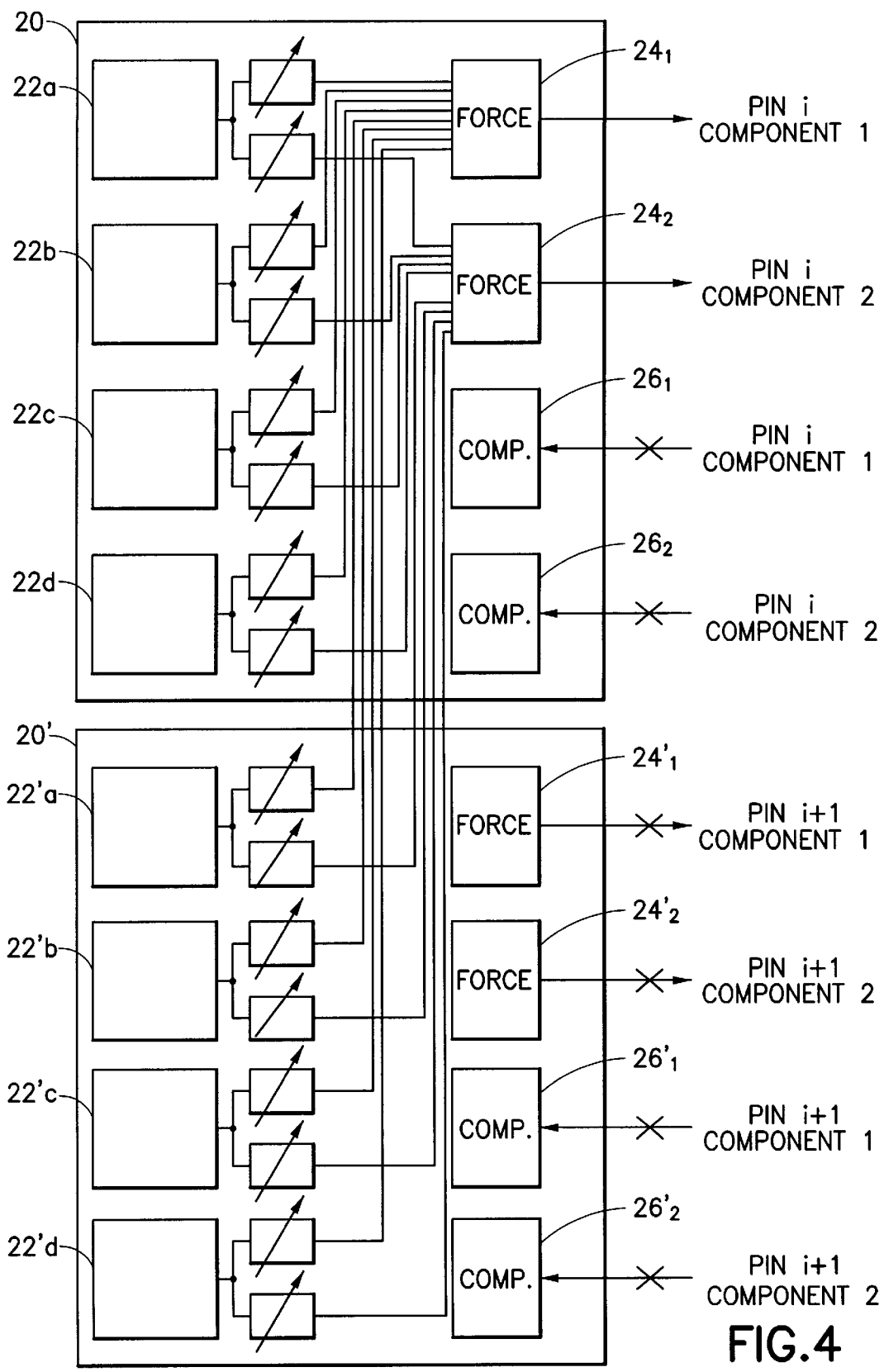
FIG. 4 is a schematic of two multiplexed test circuits of parallel test equipment in accordance with the invention.

As shown in more detail in FIGS. 3 and 4, and in FIG. 1 (prior art), a circuit 20 for parallel testing of two components 1 and 2 includes a set of timing generators formed of four generators 22a, 22b, 22c, 22d adapted to control forcing circuits $24_1$, $24_2$ and comparator circuits $26_1$, $26_2$. Each forcing circuit $24_1$, $24_2$ delivers a forcing signal to a given pin $i$ of the components 1 and 2 under test. A respective comparator circuit $26_1$, $26_2$ receives the response signal from each pin $i$.

Referring to FIG. 1, note also the presence of circuits 221a through 222d for adjusting the timing of the various test signals over a dynamic range of 5 ns. In FIG. 1, the timing generators 22a, . . . 22d are connected to the forcing circuits $24_1$, $24_2$ and the comparator circuits $26_1$, $26_2$ in such manner as to produce forcing signals and response signals that are mutually synchronous, at a repetition frequency of 100 MHz, for example.

FIG. 3 shows a situation in which the pins $i$ of the electronic components 1 and 2 are not tested, the comparator circuits $26_1$, $26_2$ not being used. In this case, all of the generators 22a, 22b, 22c, 22d are assigned to the forcing circuits $24_1$, $24_2$ only so that the forcing signals at the identical pins $i$ of the components are synchronous, but this time with a repetition frequency which is twice that of the test signals of the circuit from FIG. 1, for example 200 MHz instead of 100 MHz.

FIG. 4 concerns an arrangement in which a circuit 20 for testing identical pins $i$ with a certain parity is multiplexed with a circuit 20' for testing identical pins i+1 with the opposite parity.

The situation shown in FIG. 4 is the same as that of FIG. 1 in the sense that only one test signal, for example a forcing signal, is applied to only the identical pins $i$ with a given parity of the electronic components 1 and 2. The forcing circuits $24_1$, $24_2$ of the test circuit 20 are then connected to all of the timing generators 22a, 22b, 22c, 22d; 22'a, 22'b, 22'c, 22'd so that the forcing signals are synchronous at said identical pins $i$ with the given parity of the components 1 and 2. The repetition frequency of the signals is again doubled, to 400 MHz.

We claim:

1. Apparatus for automatically testing electronic components in parallel, comprising a plurality of test circuits (20; 20') respectively associated with identical pins ($i$; i+1) of said components, each test circuit (20; 20') including, firstly, timing generators (22a, 22b, 22c, 22d; 22'a, 22'b, 22'c, 22'd) controlled by a test programming memory (10) and, secondly, forcing circuits ($24_1$, $24_2$; $24'_1$, $24'_2$) and comparator circuits ($26_1$, $26_2$, $26'_1$, $26'_2$), controlled by said timing generators, characterized in that said forcing circuits or said comparator circuits of at least one test circuit are connected to all the timing generators in such manner that the test signals are synchronous at said identical pins ($i$) of said electronic components, wherein a circuit (20) for testing identical pins ($i$) with a certain parity is multiplexed with a circuit (20') for testing identical pins (i+1) with the opposite parity, wherein the forcing circuits (24$_1$, 24$_2$) or the comparator circuits of the same test circuit (20) are connected to the timing generators (22a, 22b, 22c, 22d; 22'a' 22'b, 22'c, 22'd) of the test circuits (20, 20') in such manner that the test signals are synchronous at said identical pins (i) of said electronic components.

2. A method of automatically testing, in parallel, a plurality of electronic components having a plurality of respectively identical pins, the method comprising the steps of:

interchanging, in parallel, test signals between said respectively identical pins of said plurality of electronic components and at least one common test circuit, wherein the test circuit includes timing generators, forcing circuits and comparator circuits;

controlling the timing generators with a test programming memory;

controlling the forcing circuits and comparator circuits with the timing generators; and assigning said timing generators to only one of said forcing circuits or said comparator circuits so as to produce synchronous test signals at said identical pins of said electronic components.

3. Apparatus for automatically testing, in parallel, a plurality of electronic components having a plurality of respectively identical pins, the apparatus comprising:

a plurality of test circuits associated with the plurality of respectively identical pins of said plurality of electronic components, each of said plurality of test circuits including:

timing generators controlled by a test programming memory, forcing circuits controlled by said timing generators, and comparator circuits controlled by said timing generators, wherein only said forcing circuits or only said comparator circuits of at least one of the plurality of test circuits are actively coupled to all of the timing generators at any point in time such that test signals are synchronous at the respectively identical pins of said plurality of electronic components.

4. Apparatus according to claim 3 wherein only said forcing circuits or only said comparator circuits of the same test circuit are actively coupled to the timing generators of such test circuit so that the test signals are synchronous at respectively identical pins of said plurality of electronic components.

5. Apparatus according to claim 3 wherein the plurality of test circuits comprises first and second test circuits, wherein the first test circuit which tests a first plurality of respectively identical pins having a certain parity is multiplexed with the second test circuit which tests a second plurality of identical pins with an opposite parity, and wherein only the forcing circuits or only the comparator circuits of one of the first and second test circuits are actively coupled to the timing generators of the first and second test circuits so that the test signals are synchronous at a corresponding one of said first and second plurality of respectively identical pins of said plurality of electronic components.

* * * * *